US007728642B1

(12) United States Patent
O'Dwyer

(10) Patent No.: US 7,728,642 B1
(45) Date of Patent: Jun. 1, 2010

(54) RIPPLE COUNTER BASED PROGRAMMABLE DELAY LINE

(75) Inventor: John G. O'Dwyer, Dublin (IE)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 12/270,102

(22) Filed: Nov. 13, 2008

(51) Int. Cl.
*H03H 11/26* (2006.01)

(52) U.S. Cl. ........................ 327/265; 327/279; 327/299

(58) Field of Classification Search ................. 327/261, 327/263–265, 276–277, 279, 291–294, 297–299
See application file for complete search history.

(56) References Cited

U.S. PATENT DOCUMENTS

| | | | | |
|---|---|---|---|---|
| 5,060,243 | A | 10/1991 | Eckert | |
| 6,137,333 | A * | 10/2000 | Williams et al. | 327/261 |
| 6,255,880 | B1 | 7/2001 | Nguyen | |
| 6,259,283 | B1 | 7/2001 | Nguyen | |
| 6,285,226 | B1 | 9/2001 | Nguyen | |
| 6,373,308 | B1 | 4/2002 | Nguyen | |
| 6,445,228 | B1 | 9/2002 | Nguyen | |
| 6,496,045 | B1 | 12/2002 | Nguyen | |
| 6,501,312 | B1 | 12/2002 | Nguyen | |
| 6,566,918 | B1 | 5/2003 | Nguyen | |
| 6,714,057 | B2 | 3/2004 | Nguyen | |
| 6,744,289 | B2 | 6/2004 | Nguyen et al. | |
| 6,788,120 | B1 | 9/2004 | Nguyen | |
| 6,879,202 | B2 | 4/2005 | Nguyen | |
| 6,906,562 | B1 | 6/2005 | Nguyen | |
| 6,906,571 | B1 | 6/2005 | Nguyen | |
| 6,914,460 | B1 | 7/2005 | Nguyen | |
| 6,924,684 | B1 | 8/2005 | Nguyen | |
| 7,005,900 | B1 | 2/2006 | Nguyen | |
| 7,071,751 | B1 | 7/2006 | Kaviani | |
| 7,139,361 | B1 | 11/2006 | Nguyen | |
| 7,227,398 | B2 * | 6/2007 | Rosen | 327/292 |
| 7,236,557 | B1 | 6/2007 | Nguyen | |
| 7,535,278 | B1 * | 5/2009 | Ondris et al. | 327/291 |

OTHER PUBLICATIONS

Xilinx, Inc.; U.S. Appl. No. 11/505,696, filed Aug. 16, 2006 by Pi et al.

Xilinx, Inc.; U.S. Appl. No. 11/717,810, filed Mar. 13, 2007 by Ondris et al.

* cited by examiner

*Primary Examiner*—An T Luu
(74) *Attorney, Agent, or Firm*—LeRoy D. Maunu; Lois D. Cartier

(57) ABSTRACT

A programmable delay line includes a first oscillator that is enabled and generates a plurality of clock cycles of a clock signal in response to a transition of the input signal. A first programmable ripple counter is coupled to the first oscillator, counts with each successive clock cycle to a programmed count, and generates a first signal in response to reaching the programmed count. A control circuit is coupled to the first oscillator and to the first programmable ripple counter. The control circuit transitions the output signal and disables the first oscillator in response to the first signal.

19 Claims, 7 Drawing Sheets

600
502
504
1
612'
606
602
604
216"
226'
224'
222'
230'
ripple counter
210'
reload
rising edge
offset
value
212'
218'
enable
oscillator
206'
rising
edge
initial
phase
208'
S
Q
R
output
signal
204
612"
224"
222"
230"
226"
input
signal
202
ripple counter
210"
falling edge
offset
value
212"
216"
218"
enable
oscillator
206"
falling edge
initial
phase
208"

RIPPLE COUNTER BASED PROGRAMMABLE DELAY LINE

FIELD OF THE INVENTION

The present invention generally relates to a programmable delay line that uses a ripple counter in generating an output signal that is a delayed representation of an input signal.

BACKGROUND

Programmable delay lines can be implemented using synchronous counters. In such a programmable delay line, an input trigger signal starts an oscillator or some other means of generating or gating a high speed clock signal, which is used to clock a synchronous counter. A digital comparator is used to generate the output signal when the counter reaches a predetermined value. The delay between the input signal and the output signal can be varied by changing the predetermined value that is compared to the counter output.

Many implementations of counter-controlled delay lines use synchronous counters to ensure that all of the counter output bits transition simultaneously, in order to offer the highest timing margin for the compare function. However, these implementations typically compromise between speed of operation, area, power consumption, and the width of the counter. For example, the counter needs to be as fast as possible in order to minimize the area needed for the oscillator. However, a fast counter may increase power consumption. Furthermore, the counter may need to be some number of bits wide to achieve the desired delay. However, the wide counter may consume a larger-than-desired area of the circuit. These and other concerns create problems in implementing counter-controlled delay lines.

The present invention may address one or more of the above issues.

SUMMARY

The various embodiments of the invention provide a programmable delay line. In one embodiment, a first oscillator is enabled and generates a plurality of clock cycles of a clock signal in response to a transition of an input signal. A first programmable ripple counter is coupled to the first oscillator and counts with each successive clock cycle to a programmed count. The counter generates a first signal in response to reaching the programmed count. A control circuit is coupled to the first oscillator and to the first programmable ripple counter. The control circuit transitions the output signal and disables the first oscillator in response to the first signal.

In another embodiment, a programmable delay circuit comprises an enable circuit that generates an enable signal in response to the input signal having a different value from the output signal. An oscillator is coupled to the enable circuit and generates a plurality of clock cycles of a clock signal in response to the enable signal. A programmable ripple counter is coupled to the enable circuit and to the oscillator. The ripple counter begins at a programmed offset value and counts with each successive clock cycle, generating a first signal in response to counting to a limit that is one of a maximum or minimum value of the programmable ripple counter. A state circuit is coupled to the ripple counter and inverts a current state of the output signal in response to the first signal.

A programmable delay line, in another embodiment, comprises means for generating an enable signal in response to the input signal having a different state from the output signal. Means are provided for generating a plurality of clock cycles beginning from a programmable initial phase in response to the enable signal. The delay line further includes means for counting a number of the clock cycles beginning from a programmed offset value and means for generating a first signal upon the number reaching a predetermined limit value. Means for inverting a current state of the output signal in response to the first signal are also provided.

It will be appreciated that various other embodiments are set forth in the Detailed Description and Claims, which follow.

BRIEF DESCRIPTION OF THE DRAWINGS

Various aspects and advantages of the invention will become apparent upon review of the following detailed description and upon reference to the drawings, in which.

DETAILED DESCRIPTION OF THE DRAWINGS

Figure 1:
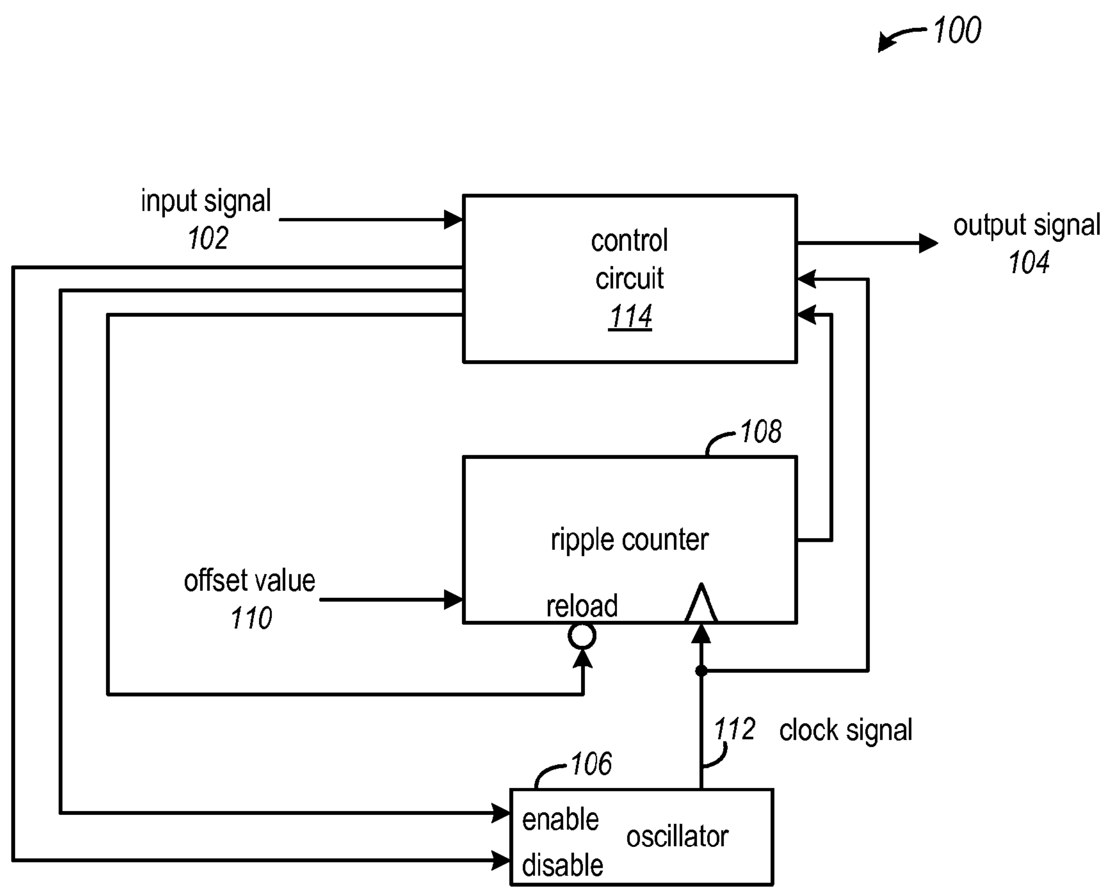
FIG. 1 is a block diagram of a programmable delay line according to an example embodiment of the present invention.

FIG. 1 is a block diagram of a programmable delay line 100 according to an example embodiment of the present invention. The programmable delay line 100 generates an output signal 104 as a delayed version of an input signal 102. The programmable delay line 100 includes oscillator 106 and ripple counter 108, which is programmable with an offset value 110. The offset value 110 to the ripple counter 108 controls the duration of the delay by controlling how far the ripple counter counts.

A transition of the input signal 102 enables the oscillator 106, which generates cycles of a clock signal 112 that is provided to the ripple counter 108. When the oscillator 106 is enabled, the ripple counter counts cycles of the clock signal 112. In response to the ripple counter 108 reaching the desired count from the offset value 110, a control circuit 114 transitions the output signal 104. In response to the transition of the output signal 104, the control circuit disables the oscillator 106 and reloads the ripple counter 108 with the offset value 110. After disabling the oscillator 106 and reloading the ripple counter 108, the programmable delay line 100 is ready for the next transition of the input signal 102.

Figure 2:
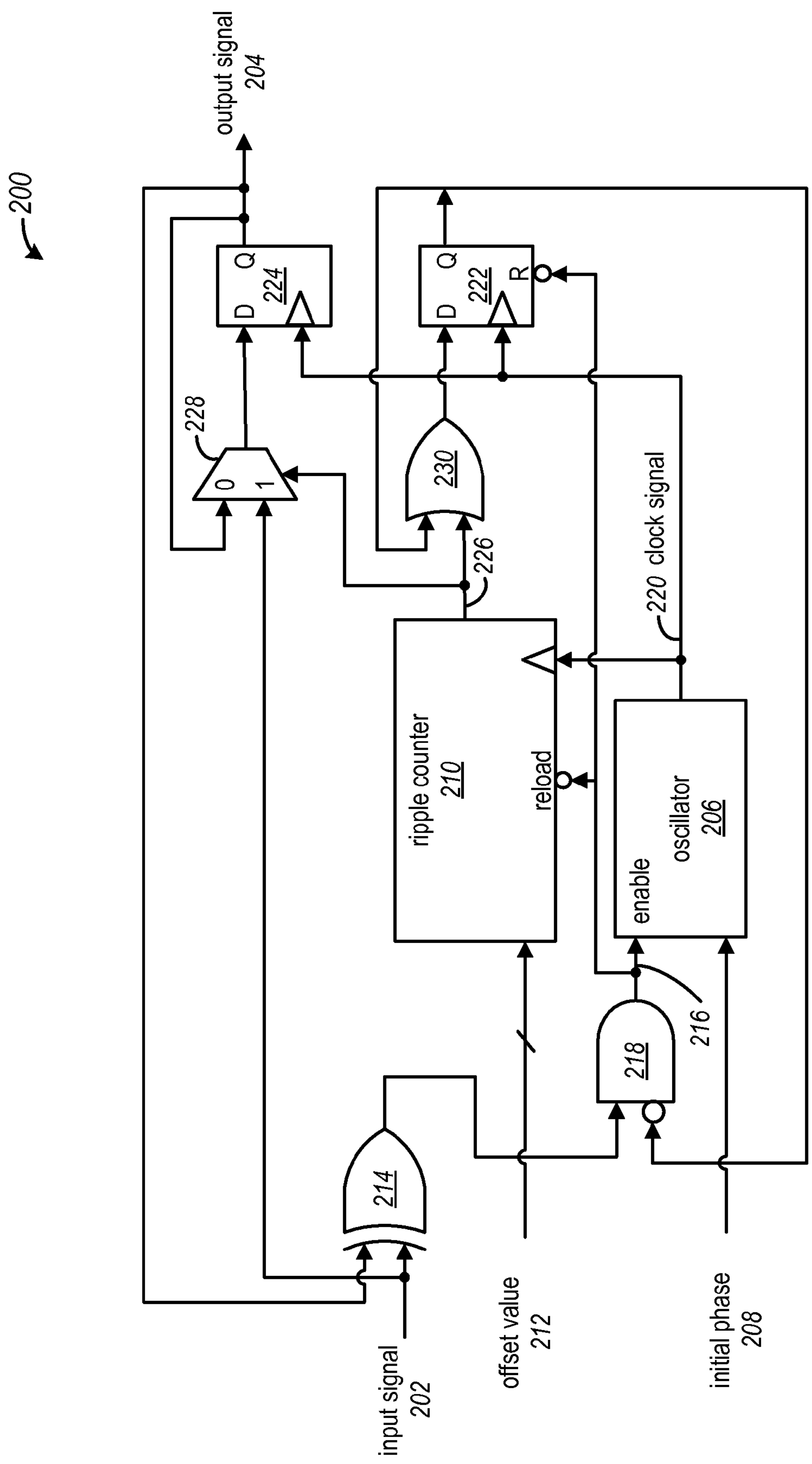
FIG. 2 is a block diagram of a programmable delay line according to another example embodiment of the present invention.

FIG. 2 is a block diagram of a programmable delay line 200 according to another example embodiment of the present invention. The programmable delay line 200 generates an output signal 204 that is a delayed representation of the input signal 202. The programmable delay line 200 includes a ring oscillator 206 that is programmable with an initial phase 208 and a programmable ripple counter 210 that is programmable with an offset value 212. The combination of the initial phase (LSBs) and the offset value (MSBs) sets the overall delay of the delay line. The logic that includes XOR gate 214, AND gate 218, flip-flop 222, and OR gate 230 generally controls enabling and disabling of the oscillator 206 and reloading of the ripple counter 210 with the offset value 212. Flip-flop 224 and multiplexer 228 generally control the transition of the output signal 204 with the delay based on the output 226 from the ripple counter 210 as programmed with the offset value 212.

In one implementation, the ring oscillator has eight different initial phases available. The available initial phases provide control over the resolution of the delay line finer than 1 oscillator period. For example, if one oscillator signal period is 8 delay units, the eight different initial phases allow the oscillator signal to start at any one of the eight phases. Specifically, the first rising edge of the oscillator signal can be delayed from 0 to 7 delay units. The overall delay of the delay line is the count of the number of cycles plus some number of delay units.

The general behavior of the programmable delay line 200 is described in this paragraph with further details provided in the paragraphs that follow. It is assumed that both flip-flops 222 and 224 start in the reset state, though the reset circuitry is not shown in order to avoid obscuring the embodiment of the invention. When a rising edge of input signal 202 occurs, the input signal passes through gates 214 and 218 to enable the oscillator 206, which in turn starts the counting by the ripple counter 210. When all bits of the ripple counter have a logic level of 1, which indicates that the desired count has been reached, the ripple counter's output 226 sets the output of flip-flop 222 high and also selects the input signal 202 via multiplexer 228 for the D input of flip-flop 224 (in this example it will be a high logic level). On the next edge of the clock signal 220, the output signal 204 is set to a high logic level, and the output of flip-flop 222 is used to disable the oscillator 206 and reload the programmable ripple counter 210. Flip-flop 222 also resets itself (via AND gate 218). With the output signal 204 at a high logic level, XOR gate 214 effectively inverts the input signal 202, which disables the oscillator 206; on the next falling edge of the input signal 202 the oscillator 206 will subsequently be enabled. A similar sequence is followed after a falling edge, and when the sequence completes the output signal 204 will be at a low logic level and the programmable delay line 200 will be set up again for the next rising edge of the input signal 202.

The following paragraphs provide further description of the example programmable delay line 200. The input signal 202 and the output signal 204 are provided to XOR gate 214 which effectively detects a transition of the input signal 202 (i.e., gate 214 outputs a high logic level signal whenever the level of the input signal 202 is different from the level of the output signal 204). The transition of the input signal produces an enable signal 216, via AND gate 218, which causes the oscillator 206 to generate the clock signal 220 that is provided to the ripple counter 210 and to flip-flops 222 and 224. In an example implementation, the clock signal 220 generated by the ring oscillator 206 has a clock period of approximately 400 picoseconds; the period will vary according to application and implementation requirements. The initial phase adjustment allows a fine adjustment of the delay by shifting the starting time of the counter by some integer division of the clock period. In this example implementation the initial phase is set by three bits giving eight values of phase shift in steps of 50 picoseconds.

The ripple counter 210 counts clock cycles of the clock signal 220 beginning from the offset value 212 until all bits of the ripple counter 210 reach logic level 1. The ripple counter 210 then produces the overflow signal 226. The overflow signal 226 is provided to the multiplexer 228 to select either the input signal 202 or the output signal 204. In response to all bits of the ripple counter 210 reaching logic level 1, the high logic level of overflow signal 226 causes the multiplexer 228 to select the input signal 202 for the D input of flip-flop 224. The flip-flop 224 then provides the output signal 204 on the next rising edge of the clock signal 220; the output signal 204 then has the same logic level as the input signal 202. In one implementation, the multiplexer 228 and the flip-flop 224 can be replaced with a toggle flip-flop. The toggle flip-flop toggles its state responsive to the overflow signal 226 in order to change the output signal 204 to have the same logic level as the input signal 202.

The overflow signal 226 also disables the oscillator 206 and reloads the programmable ripple counter 210 with the offset value 212. In response to the overflow signal 226, a high logic level signal is provided to the D input of flip-flop 222 via OR gate 230. The flip-flop 222 then provides a high logic level signal on the next rising edge of the clock signal 220, which deasserts the enable signal 216 via AND gate 218 and disables the oscillator 206. The deassertion of the enable signal 216 also causes reloading of the programmable ripple counter 210 with the offset value 212 and resetting of the flip-flop 222. With the feedback of the output signal 204 to the XOR gate 214 causing the deassertion of the enable signal 216, there is a small delay. If a transition of the input signal 202 occurred during this small delay, the oscillator 206 would undesirably remain enabled and the ripple counter 210 would again run through the counter cycle. Thus, to avoid this unwanted behavior the output of the flip-flop 222 is used to disable the oscillator 206, thereby ensuring that the oscillator 206 is disabled and the ripple counter 210 is reloaded for a minimum time set by the loop delay around the flip-flop 222 and AND gate 218.

The programmable delay line 200 delays one edge of the input signal 202 at a time. If the time between the arrival of the first transition of the input signal 202 and the arrival of the next transition of the input signal 202 is shorter than the programmed delay between the input signal 202 and the output signal 204, the programmable delay line 200 will not respond to the first transition. In other words, the programmable delay line 200 filters out pulses of the input signal 202 that are shorter than the programmed delay. This is because by the time that the programmable ripple counter 210 asserts the overflow signal 226 to the multiplexer 228 to select the input signal 202 for the flip-flop 224, the input signal will already have transitioned back to the previous state, which is the current state of flip-flop 224. In one implementation, the programmed delay is selected in order to filter out pulses of the input signal 202 that are shorter that a given time interval. For applications or implementations in which the delay line is also required to filter long pulses, a counter of near arbitrary width may be constructed by using a ripple counter without consuming a large number of resources (area, power, etc.).

Figure 3:
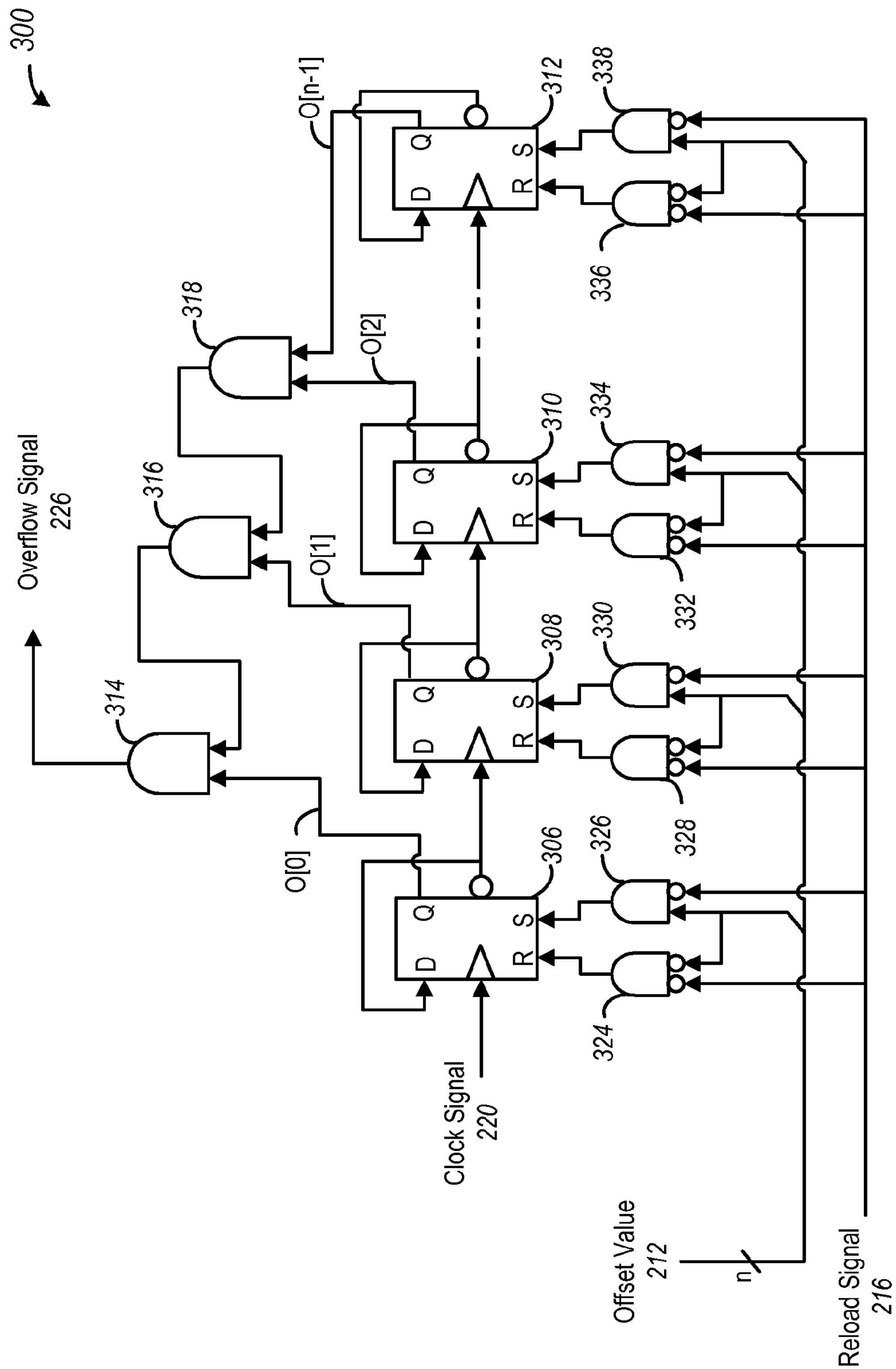
FIG. 3 illustrates a block diagram of a ripple counter, which could be used as the programmable ripple counter of FIG. 2, according to an example embodiment of the present invention.

FIG. 3 illustrates a block diagram of a ripple counter 300, which could be used as the programmable ripple counter 210 of FIG. 2, according to an example embodiment of the present invention. The ripple counter 300 counts a desired number of clock cycles of the clock signal 220 and produces the overflow signal 226 when this number of clock cycles have been counted, with the offset value 212 being the ones complement of the number of cycles desired for delay. The ripple counter 300 includes a number of serially coupled flip-flops 306-312 (the ~Q output from each flip-flop, designated in FIG. 3 by a bubble on the flip-flop output, enables the next flip-flop in the counter), with the number of flip-flops determining the maximum number of clock cycles that the ripple counter is capable of counting. For example, a ripple counter that has three serially coupled flip-flops 306-310 would be capable of counting seven clock cycles and then producing the overflow signal 226. The output of the overflow signal is delayed only by the delay of the least significant flip-flop 306 and the delay of one AND gate 314. Those skilled in the art will recognize that in an alternative embodiment the ripple counter 300 could be implemented to count down to a minimum value of the ripple counter instead of counting up to a maximum value, for example counting to all 0 bits with the offset value 212 being the number of cycles desired for delay.

The overflow signal 226 is produced via AND gates 314-318 when the output signals O[0]-O[n] of the flip-flops 306-312 are all logic level 1 (e.g., when all the output signals O[0]-O[n] have a high logic level). The lower the significance of the output bit of a flip-flop, the faster the path of the output bit to the overflow signal 226. Thus, by defining the overflow condition to be when the output signals of the flip-flops 306-312 are all logic level 1, there is minimal delay between when the ripple counter 300 reaches the maximum value and when the overflow signal 226 goes high.

In one implementation, only the first one or two flip-flops (e.g., 306 and 308, which produce the least significant output bits) in the ripple counter 300 have high speed characteristics (provided, for example, with larger transistors). All of the remaining flip-flops (e.g., 310-312) can shift the balance from high-speed to lower power consumption, thereby decreasing the power consumption of the ripple counter 300. In another implementation, the flip-flops 306-312 can be scan flip-flops in order to simplify production testing of the ripple counter 300.

The programmable ripple counter 300 is initially programmed with the offset value 212, from which the ripple counter 300 starts counting the clock cycles of the clock signal 220. For example, a ripple counter that has three flip-flops 306-310 would require a three bit offset value. The offset value 212 is an (n+1)-bit signal with (n+1) equal to the number of flip-flops in the ripple counter 300. The offset value 212 is asynchronously loaded into the flip-flops 306-312 in response to a reload signal 216 via AND gates 324-338 using the set (S) and reset (R) inputs of the flip-flops 306-312. The reset input of a flip-flop is triggered when the offset value 212 indicates that the flip-flop is to be set to the low logic level, and the set input of a flip-flop is triggered when the offset value 212 indicates that the flip-flop is to be set to the high logic level. The offset value 212 is loaded into the flip-flops 306-312 when the reload signal 216 has a low logic level.

Figure 4:
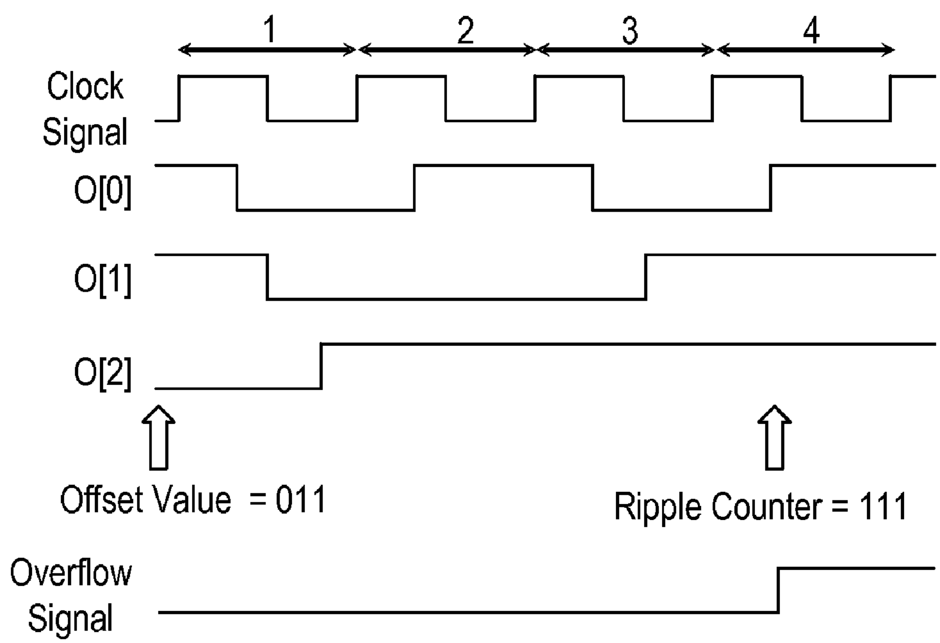
FIG. 4 is a timing diagram relating to the operation of a ripple counter according to an example embodiment of the present invention.

FIG. 4 is a timing diagram relating to the operation of a ripple counter according to an example embodiment of the present invention. The example shown in FIG. 4 is for an application that counts four clock cycles using a programmable ripple counter that has three flip-flops (e.g., flip-flops 306-310 of FIG. 3). The flip-flops of the ripple counter are loaded with an offset value of 011 (i.e., decimal 3). Thus, initially, O[2]=0, O[1]=1, and O[0]=1, which is the ones-complement form of the four (decimal $4=100_2$) clock cycles to count.

The ripple counter begins counting clock cycles when the clock signal 220 is provided to the ripple counter. The first rising edge of the clock signal results in the output state of the ripple counter being 100, with O[0] changing to zero, O[1] changing to zero, and O[2] changing to one. The second rising edge of the clock signal results in the output state of the ripple counter being 101, the third rising edge of the clock signal results in the output state of the ripple counter being 110, and the fourth rising edge of the clock signal results in the output state of the ripple counter being 111. When the output state of the ripple counter is 111, the overflow signal 226 transitions to the high logic level, thereby indicating that the desired number of clock cycles have been counted, in this case four clock cycles. As can be seen in the timing diagram of FIG. 4, the transitions of the flip-flop outputs O[0], O[1] and O[2] are less frequent for the more significant bits of the counter. In addition, the higher order bits always transition after the lower order bits, ensuring that a decode of all 1's cannot occur as a transitioning state until the desired clock cycle. By decoding all 1's instead of all 0's with an OR gate structure, the offset value 212 is the ones-complement of the desired count. If an all 0's decode is used, the offset 212 is the same as the desired count. Thus, by having the least significant bit O[0] have the fastest path to the overflow signal 226, the output of the overflow signal upon the output state of the ripple counter being 111 is delayed only by the clock-enable-to-output delay of one flip-flop plus the delay of one AND gate (e.g., AND gate 314 of FIG. 3).

As described above, if the delay value is greater than the pulse width of the input signal, the pulse will be filtered from the output signal. This may be a limitation when using the delay line to adjust the arrival time of an input signal, because the required delay value may range from zero to the unit-interval of the signal (the nominal HIGH or LOW time of the incoming data) in order to allow the sampling circuit to capture the input data midway between the edges irrespective of the phase of the input signal when it arrives.

In a synchronous system, the unit-interval of the incoming data equals the rate at which the data is sampled. However as signaling systems get faster the duration of the HIGH phase or LOW phase of each individual bit in the signal may vary about a mean duration, due to jitter and other non-idealities in the signaling system. If the input delay is set to one unit-interval under these circumstances, then any reduction in the durations of the HIGH phase or the LOW phase will result in a loss of data, because of the filtering effect of the delay line. The embodiments shown in FIGS. 5 and 6 and described below address this scenario.

Figure 5:
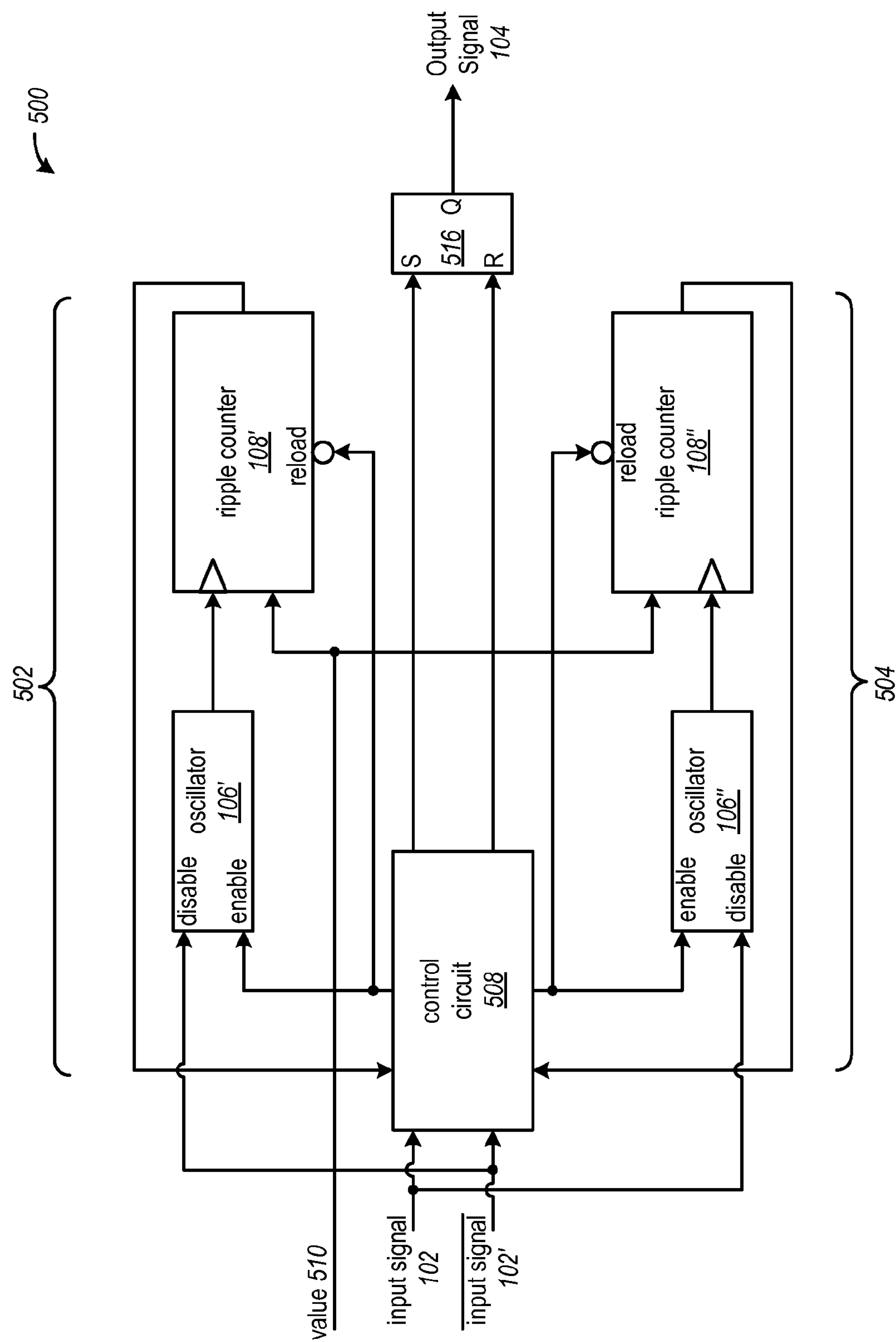
FIG. 5 is a block diagram of a programmable delay line according to another embodiment of the invention.

FIG. 5 is a block diagram of a programmable delay line 500 according to another embodiment of the invention. The delay line 500 is designed based on the observation that in order for a synchronous system to sample the incoming signal without error, there can never be more than two edges within a unit-interval. For example, if the signal transitions HIGH, LOW, and then HIGH again before the next sampling of the signal, only one transition is detected. The delay line 500 includes two parallel delay lines in parallel, so that when one is working the other is ready to receive the signal. In the example embodiment, the first delay line 502 responds to rising edges of the input signal and the second delay line 504 responds to falling edges of the input signal. Elements of FIG. 5 that correspond to elements of FIG. 1 have the same reference numerals. Since there are two delay lines, the reference numerals are primed and double-primed to correspond to the two delay lines 502 and 504.

The input signal 102 and the complement input signal 102' are input to control circuit 508. The input signal 102 enables oscillator 106' and disables oscillator 106", while the complement input signal 102' enables oscillator 106" and disables oscillator 106'. The input value 510 is input to both ripple counters 108' and 108", with the loading/reloading of the ripple counter 108' being controlled by control circuit 508 responsive to complement input signal 102', and the loading/reloading of the ripple counter 108" being enabled by control circuit 508 responsive to input signal 102. The two delay line output signals provide the set and reset inputs to SR flip-flop 516, which provides the output signal to the sampler (not shown).

Figure 6:
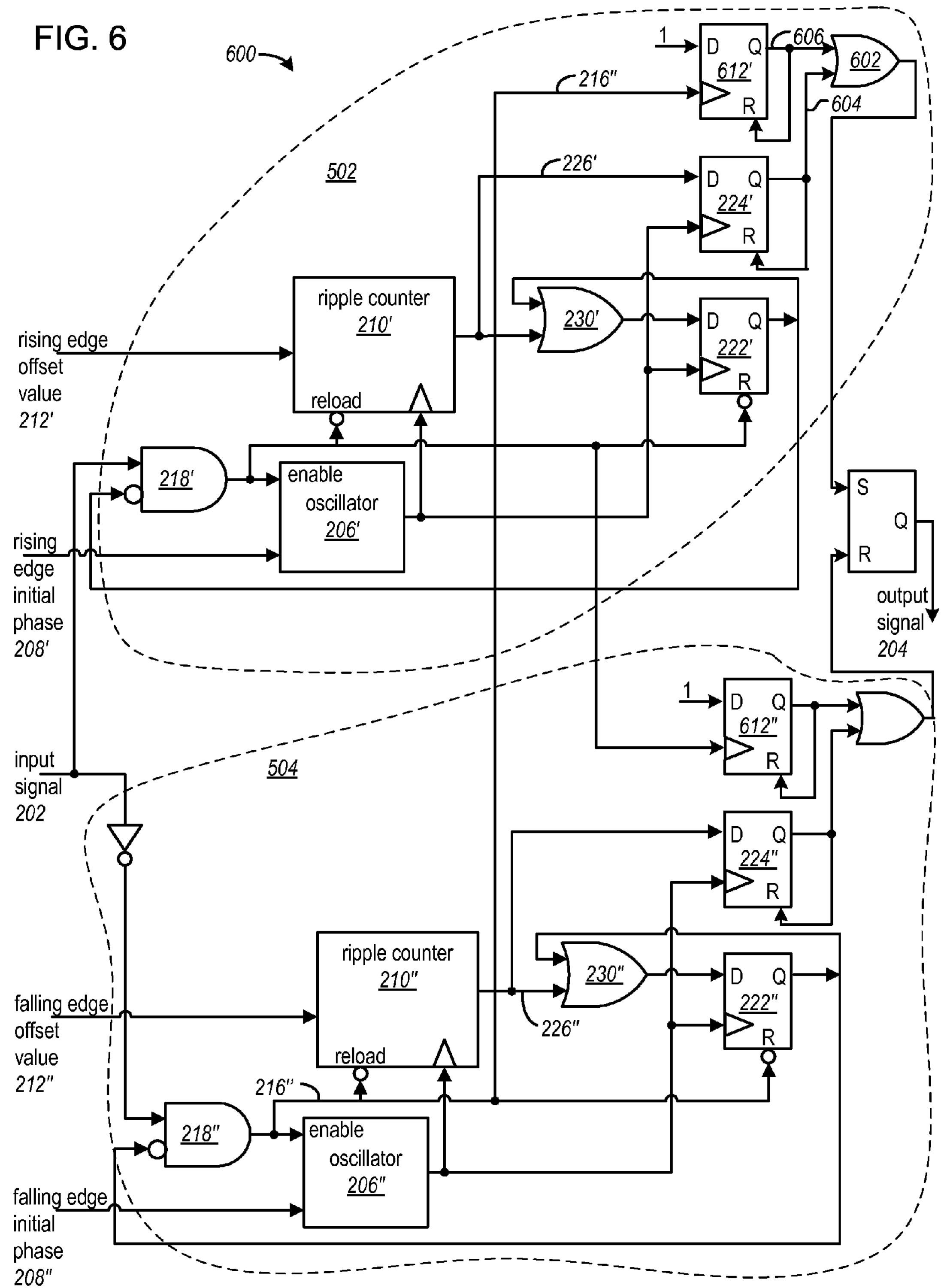
FIG. 6 is a block diagram of a delay line according to another embodiment of the invention.

FIG. 6 is a block diagram of a delay line 600 according to another embodiment of the invention. The delay line 600 shows further details for implementing the delay line 500 of FIG. 5. Elements of FIG. 6 that correspond to elements of FIG. 2 have the same reference numerals. Since there are two delay lines, the reference numerals are primed and double-primed to correspond to the two delay lines 502 and 504.

The delay line 600 operates in a manner similar to delay line 200 as shown in FIG. 2 and described above, except that the output signal 204 is not sampled from the input signal 202. Rather, the output signal 204 is generated as an OR function (OR gate 602) of one of two pulses. The first pulse 604 is generated when delay line 502 finishes counting and produces an output signal 226' delayed by the desired amount of time. The second pulse 606 is generated as a result of the opposite delay line 504 enable signal 216", which is triggered by the complemented input signal 202 to AND gate 218" and applied to flip-flop 612', which stores a logic 1 bit. Flip-flop 612" operates similarly in delay line 504.

When the rising edge offset value 212' exceeds the HIGH or LOW time of an individual bit in the input signal, the first ripple counter 210' will stop counting (and be reset) before the counter has a chance to finish as a result of a second edge. This effectively shortens the delay of the first counter 210' and makes it appear that it has finished the count. Offset values 212' and 212" are input to ripple counters 210' and 210", respectively. Similarly, initial phase values 208' and 208" are input to oscillators 206' and 206", respectively. The input offset values 212' and 212" may be different from one another, and the rising edge initial phase value 208' and falling edge initial phase value 208" may also be different from one another. The rising and falling edges can be adjusted independently and so allow an application to change the duty cycle of the signal, and, if needed, correct for duty cycle distortion as the signal passes through the delay line.

Figure 7:
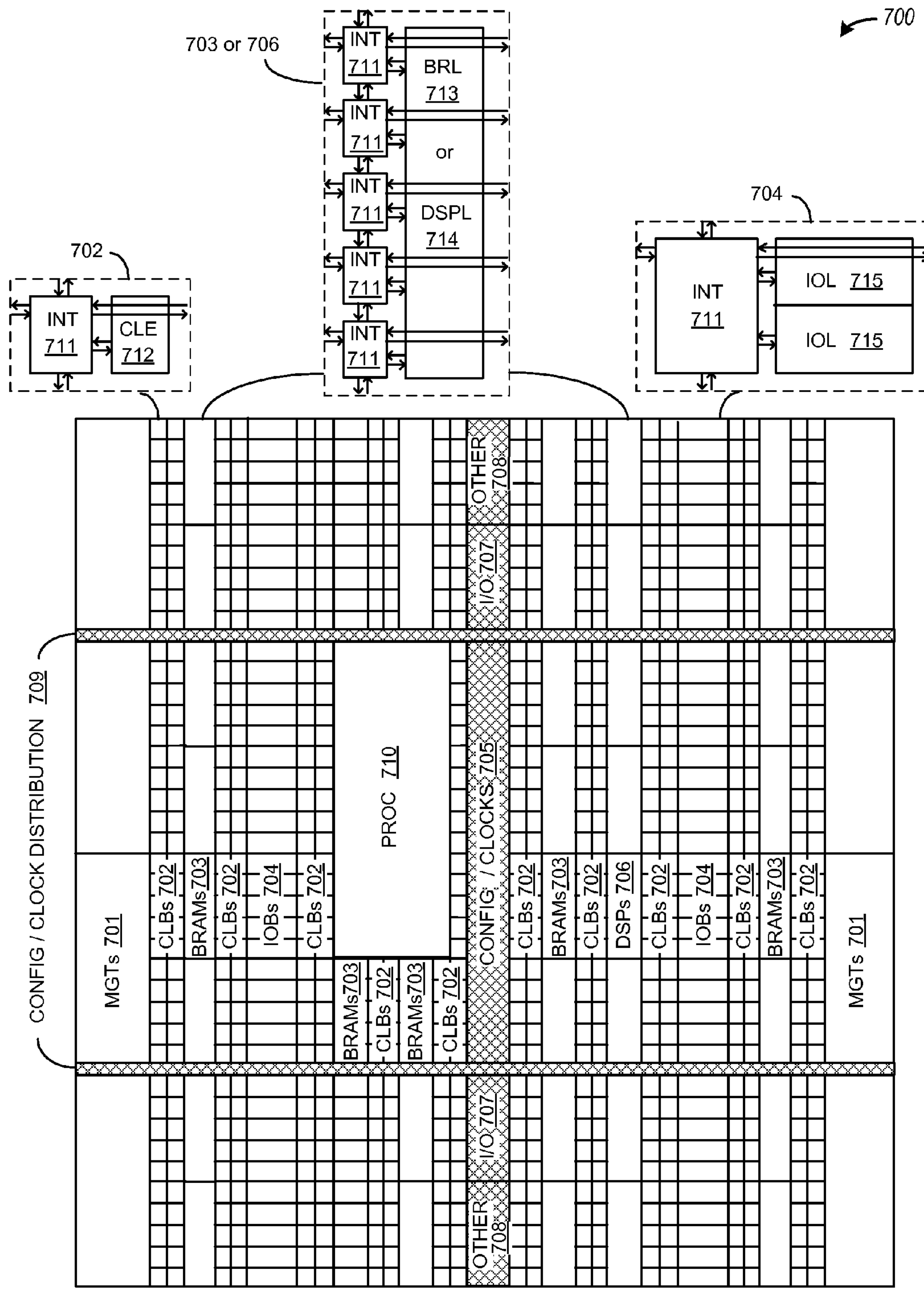
FIG. 7 illustrates an FPGA architecture that includes several different types of programmable logic blocks, according to an example embodiment of the present invention.

FIG. 7 illustrates an FPGA (field programmable gate array) architecture that can be used to implement programmable delay lines according to an example embodiment of the present invention. Advanced FPGAs can include several different types of programmable logic blocks in the array. For example, FIG. 7 illustrates an FPGA architecture 700 that includes a large number of different programmable tiles including multi-gigabit transceivers (MGTs 701), configurable logic blocks (CLBs 702), random access memory blocks (BRAMs 703), input/output blocks (IOBs 704), configuration and clocking logic (CONFIG/CLOCKS 705), digital signal processing blocks (DSPs 706), specialized input/output blocks (I/O 707) (e.g., configuration ports and clock ports), and other programmable logic 708 such as digital clock managers, analog-to-digital converters, system monitoring logic, and so forth. Some FPGAs also include dedicated processor blocks (PROC 710).

In some FPGAs, each programmable tile includes a programmable interconnect element (INT 711) having standardized connections to and from a corresponding interconnect element in each adjacent tile. Therefore, the programmable interconnect elements taken together implement the programmable interconnect structure for the illustrated FPGA. The programmable interconnect element (INT 711) also includes the connections to and from the programmable logic element within the same tile, as shown by the examples included at the top of FIG. 7.

For example, a CLB 702 can include a configurable logic element (CLE 712) that can be programmed to implement user logic plus a single programmable interconnect element (INT 711). A BRAM 703 can include a BRAM logic element (BRL 713) in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 706 can include a DSP logic element (DSPL 714) in addition to an appropriate number of programmable interconnect elements. An 10B 704 can include, for example, two instances of an input/output logic element (IOL 715) in addition to one instance of the programmable interconnect element (INT 711). As will be clear to those of skill in the art, the actual I/O pads connected, for example, to the I/O logic element 715 typically are not confined to the area of the input/output logic element 715.

In the pictured embodiment, a columnar area near the center of the die (shown shaded in FIG. 7) is used for configuration, clock, and other control logic. Horizontal areas 709 extending from this column are used to distribute the clocks and configuration signals across the breadth of the FPGA.

Some FPGAs utilizing the architecture illustrated in FIG. 7 include additional logic blocks that disrupt the regular columnar structure making up a large part of the FPGA. The additional logic blocks can be programmable blocks and/or dedicated logic. For example, the processor block PROC 710 shown in FIG. 7 spans several columns of CLBs and BRAMs.

Note that FIG. 7 is intended to illustrate only an exemplary FPGA architecture. For example, the numbers of logic blocks in a column, the relative width of the columns, the number and order of columns, the types of logic blocks included in the columns, the relative sizes of the logic blocks, and the interconnect/logic implementations included at the top of FIG. 7 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

The present invention is thought to be applicable to a variety of systems that use delay lines. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A programmable delay line that generates an output signal from an input signal, the programmable delay line comprising:

a first oscillator that is enabled and generates a plurality of clock cycles of a clock signal in response to a transition of the input signal;

wherein the first oscillator is enabled responsive to a rising edge of the input signal;

a second oscillator that is enabled and generates a plurality of clock cycles of a clock signal in response to a falling edge of the input signal;

a first programmable ripple counter coupled to the first oscillator, the first ripple counter counting with each successive clock cycle to a programmed count and generating a first signal in response to reaching the programmed count;

a second programmable ripple counter coupled to the second oscillator, the second ripple counter counting with each successive clock cycle to the programmed count and generating a second signal in response to reaching the programmed count; and a control circuit coupled to the first oscillator and to the first programmable ripple counter, wherein the control circuit transitions the output signal and disables the first oscillator in response to the first signal, wherein the control circuit is further coupled to the second oscillator and to the second programmable ripple counter, and the control circuit transitions the output signal in response to the first and second signals.

2. The programmable delay line of claim 1, wherein:

the first programmable ripple counter is programmable with an offset value; and the programmable ripple counter counts to the programmed count by counting from the offset value to one of a maximum value or a minimum value of the first programmable ripple counter.

3. The programmable delay line of claim 2, wherein the control circuit reprograms the programmable ripple counter with the offset value in response to the first signal.

4. The programmable delay line of claim 3, wherein:

the programmable ripple counter is implemented with a plurality of serially coupled flip-flops;

one or more of the flip-flops that store one or more corresponding least-significant bits of the programmable ripple counter operate at a first frequency and with a first level of power consumption; and one or more of the flip-flops that store one or more corresponding most-significant bits of the programmable ripple counter operate at a second frequency that is less than the first frequency and with a second level of power consumption that is less than the first level.

5. The programmable delay line of claim 1, further comprising:

an array of programmable logic and interconnect resources of a programmable integrated circuit, wherein the oscillator, programmable ripple counter, and control circuit are implemented in the programmable logic and interconnect resources of the programmable integrated circuit.

6. A programmable delay circuit that generates an output signal from an input signal, the programmable delay circuit comprising:

an enable circuit that generates an enable signal in response to the input signal having a different value from the output signal;

an oscillator coupled to the enable circuit, the oscillator generating a plurality of clock cycles of a clock signal in response to the enable signal;

a programmable ripple counter coupled to the enable circuit and to the oscillator, the ripple counter beginning at a programmed offset value and counting with each successive clock cycle, and the ripple counter generating a first signal in response to counting to a limit that is one of a maximum or minimum value of the programmable ripple counter; and a state circuit coupled to the ripple counter, the state circuit inverting a current state of the output signal in response to the first signal.

7. The programmable delay circuit of claim 6, wherein the state circuit inverts the state of the output signal by storing a current state of the input signal in response to the first signal.

8. The programmable delay circuit of claim 6, wherein the input signal has a plurality of transitions and the output signal has a plurality of transitions, each transition of the output signal corresponding to a programmed delay of one of the transitions of the input signal.

9. The programmable delay circuit of claim 6, wherein the enable circuit asserts the enable signal in response to the input signal having a different state from the output signal.

10. The programmable delay circuit of claim 9, wherein:

the enable circuit deasserts the enable signal in response to assertion of the first signal; and the programmable ripple counter reloads the offset value and deasserts the first signal in response to the deassertion of the enable signal.

11. The programmable delay circuit of claim 6, wherein the oscillator comprises a ring oscillator.

12. The programmable delay circuit of claim 6, wherein the oscillator has a programmable initial phase for a first one of the plurality of clock cycles.

13. The programmable delay circuit of claim 12, wherein the output signal is a version of the input signal that is delayed by a combination of the offset value and the initial phase.

14. The programmable delay circuit of claim 6, further comprising:

an array of programmable logic and interconnect resources of a programmable integrated circuit, wherein the enable circuit, oscillator, programmable ripple counter, and state circuit are implemented in the programmable logic and interconnect resources.

15. The programmable delay circuit of claim 6, wherein:

the programmable ripple counter includes a plurality of serially coupled flip-flops; and the first signal is asserted in response to all of the flip-flops having an asserted value.

16. The programmable delay circuit of claim 15, wherein:

one or more of the flip-flops at a beginning of the serially coupled flip-flops operates at a first frequency and with a first level of power consumption; and one or more of the flip-flops at an end of the serially coupled flip-flops operates at a second frequency that is less than the first frequency and with a second level of power consumption that is less than the first level.

17. The programmable delay circuit of claim 6, wherein:

the state circuit inverts the state of the output signal by storing a current state of the input signal in response to the first signal; and pulses of the input signal that are less than a period of the programmable ripple counter counting to the limit are filtered.

18. A programmable delay line that generates an output signal from an input signal, the programmable delay line comprising:

means for generating an enable signal in response to the input signal having a different state from the output signal;

means for generating a plurality of clock cycles beginning from a programmable initial phase in response to the enable signal;

means for counting a number of the clock cycles beginning from a programmed offset value;

means for generating a first signal upon the number reaching a predetermined limit value; and means for inverting a current state of the output signal in response to the first signal.

19. The programmable delay line of claim 18, further comprising:

means for generating a trigger in response to the first signal, wherein the means for inverting inverts the output signal in response to the trigger.

* * * * *